(12) United States Patent
Cho et al.

(10) Patent No.: US 7,885,108 B2
(45) Date of Patent: Feb. 8, 2011

(54) MEMORY PROGRAMMING METHOD

(75) Inventors: Kyoung Lae Cho, Yongin-si (KR); Dong Hyuk Chae, Seoul (KR); Jun Jin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 135 days.

(21) Appl. No.: 12/382,176

(22) Filed: Mar. 10, 2009

(65) Prior Publication Data

US 2009/0285022 A1    Nov. 19, 2009

(30) Foreign Application Priority Data

May 14, 2008    (KR) .................. 10-2008-0044535

(51) Int. Cl.
*G11C 16/00* (2006.01)
(52) U.S. Cl. ............................ 365/185.03; 365/185.24
(58) Field of Classification Search ............. 365/185.12
See application file for complete search history.

(56) References Cited

U.S. PATENT DOCUMENTS 5,241,498 A * 8/1993 Yokokura ............... 365/185.18
6,493,266 B1 * 12/2002 Yachareni et al. ......... 365/185.22

FOREIGN PATENT DOCUMENTS

| KR | 10-20020060502 | 7/2002 |
| KR | 10-200300027770 | 1/2003 |
| KR | 10-20070039720 | 4/2007 |
| KR | 10-20070057716 | 6/2007 |

* cited by examiner

*Primary Examiner*—Tan T. Nguyen
(74) *Attorney, Agent, or Firm*—Harness, Dickey & Pierce, P.L.C.

(57) ABSTRACT

A memory programming method may include identifying at least one of a plurality of memory cells with a threshold voltage to be changed based on a pattern of data to be programmed in the at least one of the plurality of memory cells, applying a program condition voltage to the at least one identified memory cell until the threshold voltage of the at least one identified memory cell is included in a first threshold voltage interval, to thereby adjust the threshold voltage of the at least one identified memory cell, and programming the data in the at least one identified memory cell with the adjusted threshold voltage.

19 Claims, 7 Drawing Sheets

MEMORY PROGRAMMING METHOD

PRIORITY STATEMENT

This application claims priority under 35 U.S.C. § 119 to Korean Patent Application No. 10-2008-0044535, filed on May 14, 2008, in the Korean Intellectual Property Office (KIPO), the entire contents of which are incorporated herein by reference.

BACKGROUND

1. Field

Example embodiments relate to apparatuses and/or methods that may program data. Also, example embodiments relate to apparatuses and/or methods that may program data in multi-level cell memory devices or multi-bit cell memory devices.

2. Description of Related Art

A single-level cell (SLC) memory device may store one bit of data in a single memory cell. The SLC memory may be referred to as a single-bit cell (SBC) memory. A process of storing one bit of data in a single level cell of the SLC memory device may be referred to as a programming process and may change a threshold voltage of the single level cell. For example, when data of logic value "1" is stored in a single level cell, the single level cell may have a threshold voltage of 1.0 V. When data of logic value "0" is stored in the single level cell, the single level cell may have a threshold voltage of 3.0 V.

Due to a minute electrical characteristic difference between the single level cells, the threshold voltage formed in each of the single level cells with the same data programmed may have a distribution within a range. For example, when a voltage read from a memory cell is greater than 0.5 V and less than 1.5 V, it may be determined that data stored in the memory cell has a logic value of "1". When the voltage read from the memory cell is greater than 2.5 V and less than 3.5 V, it may be determined that the data stored in the memory cell has a logic value of "0". The data stored in the memory cell may be classified depending on the difference between memory cell currents/voltages during the reading operations.

Meanwhile, a multi-bit cell (MLC) memory device that can store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read-failure rate may increase. To program "m" bits in a single memory cell, any one of $2^m$ threshold voltages may be required to be formed in the memory cell. Due to the minute electrical characteristic differences between memory cells, threshold voltages of memory cells with the same data programmed may form a distribution within a range. A single threshold voltage distribution may correspond to each of $2^m$ data values that can be generated according to the "m" bits.

However, since the voltage window of a memory may be limited, the distance between $2^m$ distributions of threshold voltage between adjacent bits may decrease as "m" increases, which may cause overlapping of the distributions. If the distributions are overlapped with each other, the read failure rate may increase.

SUMMARY

Example embodiments may reduce the effect of floating gate (FG) coupling during programming of a memory cell. Example embodiments may also reduce a distribution distortion of a threshold voltage during programming of a memory cell.

According to example embodiments, a memory programming method may include identifying at least one of a plurality of memory cells with a threshold voltage to be changed based on a pattern of data to be programmed in the at least one of the plurality of memory cells, applying a program condition voltage to the at least one identified memory cell until the threshold voltage of the at least one identified memory cell is included in a first threshold voltage interval, to thereby adjust the threshold voltage of the at least one identified memory cell, and programming the data in the at least one identified memory cell with the adjusted threshold voltage.

According to example embodiments, a memory programming method may include identifying at least one of a plurality of multi-bit cells corresponding to a first threshold voltage interval based on a first data page and a second data page to be programmed in the at least one of the plurality of multi-bit cells, adjusting a threshold voltage of the at least one identified multi-bit cell to be included in a second threshold voltage interval, programming the first data page in a remaining plurality of multi-bit cells that exclude the at least identified multi-bit cell, and programming the second data page in the at least one identified multi-bit cell.

BRIEF DESCRIPTION OF THE DRAWINGS

The above and other features and advantages of example embodiments will become more apparent by describing in detail example embodiments with reference to the attached drawings in which.

DETAILED DESCRIPTION OF EXAMPLE EMBODIMENTS

Figure 1:
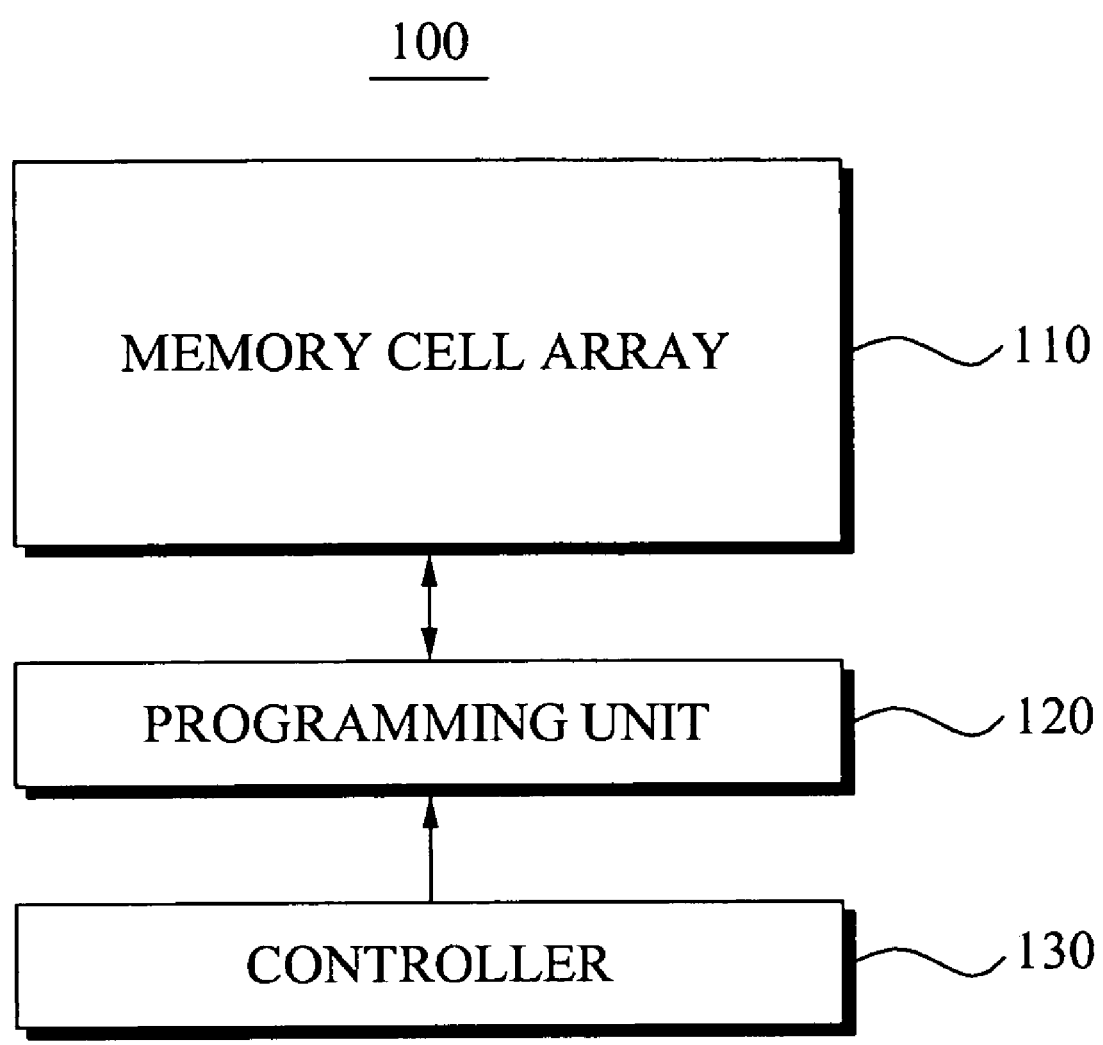
FIG. 1 is a block diagram illustrating an example of a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will be described in detail. It should be understood, however, that there is not intent to limit example embodiments to the particular forms disclosed, but to the contrary, example embodiments are to cover all modifications, equivalents, and alternatives falling within the scope of the example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

The accompanying drawings are intended to depict example embodiments and should not be interpreted to limit the intended scope of the claims. The accompanying drawings are not to be considered as drawn to scale unless explicitly noted.

Now, in order to more specifically describe example embodiments, example embodiments will be described in detail with reference to the attached drawings, wherein like reference numerals may refer to like components throughout.

FIG. 1 illustrates an example of a memory device 100 according to example embodiments.

Referring to FIG. 1, the memory device 100 includes a memory cell array 110, a programming unit 120, and a controller 130.

The memory cell array 110 may include a plurality of memory cells.

The controller 130 may identify at least one of the plurality of memory cell arrays with a threshold voltage to be changed, based on a pattern of data to be programmed in the at least one of the plurality of memory cells that are included in the memory cell array 110.

The programming unit 120 may apply a program condition voltage to the at least one identified memory cell until the threshold voltage of the memory cell is included in a first threshold voltage interval. The programming unit 120 may apply the program condition voltage to the at least one identified memory cell to thereby adjust the threshold voltage of the at least one identified memory cell. The programming unit 120 may program the data in the at least one identified memory cell with the adjusted threshold voltage.

A process of storing data by changing the threshold voltage of the memory cell may be referred to as "programming". The programming unit 120 may set a target threshold voltage interval of the memory cell based on the pattern of data to be stored in the memory cell. For example, the programming unit 120 may set a target threshold voltage interval of [1.0 V, 2.0 V] with respect to a memory cell to store data "1" and may set a target threshold voltage interval of [3.0 V, 4.0 V] with respect to a memory cell to store data "0".

The programming unit 120 may apply the program condition voltage to the memory cell to store data "1" until the threshold voltage of the memory cell to store data "1" is included in the target threshold voltage interval of [1.0 V, 2.0 V]. According to example embodiments, when the programming operation increases the threshold voltage of the memory cell, the programming unit 120 may set the lower bound value 1.0 V of the target threshold voltage interval as a program verify voltage. The programming unit 120 may apply the program condition voltage to the memory cell to store data "1" during a unit programming period. When the threshold voltage of the memory cell to store data "1" is less than the program verify voltage, the programming unit 120 may apply again the program condition voltage to the memory cell to store data "1" during another unit programming period. Conversely, when the threshold voltage of the memory cell to store data "1" is greater than the program verify voltage, the programming unit 120 may terminate the unit programming operation with respect to the memory cell to store data "1".

The programming unit 120 may apply the program condition voltage to a memory cell to store data "0" until a threshold voltage of the memory cell to store data "0" is included in the target threshold voltages section of [3.0 V, 4.0 V]. According to example embodiments, the programming unit 120 may set the lower bound value 3.0 V of the target threshold voltage interval as the program verify voltage.

The programming unit 120 may apply the program condition voltage to the memory cell during a unit programming period. The above operation may be referred to as a "unit programming operation." After performing the unit programming operation, the programming unit 120 may compare the threshold voltage of the memory cell with the program verify voltage to determine whether to perform again the unit programming operation based on a comparison result.

The memory cell of the memory device 100 to store data according to change in the threshold voltage may include a control gate and a floating gate. An insulating layer may be disposed between the control gate and the floating gate. Another insulating layer may be inserted between the floating gate and a substrate.

A programming process of storing data in the memory cell, or an erase process of erasing data stored in the memory cell may be performed according to mechanism such as Fowler-Nordheim (F-N) tunneling, hot carrier effect, and the like.

Under a particular bias condition, a channel may be formed in a region most adjacent to the floating gate on a substrate region. The channel may be a region generated by clustering together minority carriers of the substrate region. The memory device 100 may control the minority carriers to thereby program data in the memory cell, or to erase the data stored in the memory cell.

When a particular bias is applied to a source, a drain, and a control gate of the substrate region, the minority carriers of the channel may move to the floating gate. A mechanism of moving the minority subcarriers to the floating gate may representatively include hot carrier effect and F-N tunneling.

Since the programming operation of changing the threshold voltage of the memory cell requires a relatively longer time than a read operation of reading data stored in the memory cell, the memory device 100 may simultaneously program a plurality of memory cells in order to reduce a programming time. A set of memory cells simultaneously programmed by the memory device 100 may be referred to as a "page". The memory device 100 may simultaneously read data from memory cells included in a single page.

According to example embodiments, the memory device 100 may set, as a single page, a set of memory cells connected to a single word line. The word line may be connected to a control gate of the memory cells included in the page.

The controller 130 may set a target threshold voltage interval of each of the memory cells based on a pattern of data to be programmed in the plurality of memory cells. Each of the memory cells of the memory device 100 may be erased prior to being programmed. The erased memory cell may be initialized and may have a threshold voltage included in an initialized threshold voltage interval. According to example embodiments, the initialized threshold voltage interval may include a negative threshold voltage.

A particular pattern among patterns of data to be programmed in the plurality of memory cells may correspond to the initialized threshold voltage interval. For example, data "1" may correspond to the initialized threshold voltage interval and data "0" may correspond to [3.0 V, 4.0 V].

According to example embodiments, in a case where the memory cell can store two-bit data, data "11" among patterns of data to be programmed in the memory cell may correspond to the initialized threshold voltage interval. In this instance, data "10", "01", and "00" may correspond to a target threshold voltage interval with a threshold voltage greater than the initialized threshold voltage interval.

According to example embodiments, in a case where the memory cell can store three-bit data, data "111" among patterns of data to be programmed in the memory cell may correspond to the initialized threshold voltage interval. In this instance, data "110", "101", "100", "011", "010", "1001", and "000" may correspond to a target threshold voltage interval with a threshold voltage greater than the initialized threshold voltage interval.

According to example embodiments, in a case where the memory cell can store four-bit data, data "1111" among patterns of data to be programmed in the memory cell may correspond to the initialized threshold voltage interval. In this instance, data "1110", "1101", "1100", "1011", "1010", "1001", "1000", "0111", "0110", "0101", "0100", "0011", "0010", "0001", and "0000" may correspond to a target threshold voltage interval with a threshold voltage greater than the initialized threshold voltage interval.

The controller 130 may identify the memory cell corresponding to the initialized threshold voltage interval based on a pattern of data to be programmed in the plurality of memory cells. The controller 130 may identify the memory cell corresponding to the target threshold voltage interval with the threshold voltage greater than the initialized threshold voltage interval.

The programming unit 120 may apply a program condition voltage to the memory cell corresponding to the target threshold voltage interval with the threshold voltage greater than the initialized threshold voltage interval. The programming unit 120 may set a first threshold voltage interval with a threshold voltage less than a target threshold voltage interval of each memory cell. The first threshold voltage interval may have the threshold voltage greater than the initialized threshold voltage interval.

The programming unit 120 may apply the program condition voltage to the memory cell until the threshold voltage of the memory cell corresponding to the target threshold voltage interval, with the threshold voltage greater than the initialized threshold voltage interval, is included in the first threshold voltage interval.

The programming unit 120 may program data in a memory cell with a threshold voltage that is included in the first threshold voltage interval. The programming unit 120 may apply the program condition voltage to the memory cell with the threshold voltage included in the first threshold voltage interval, until the threshold voltage of the memory cell with the threshold voltage included in the first threshold voltage interval is included in the target threshold voltage interval.

The programming unit 120 may adjust a threshold voltage of each of memory cells, identified by the controller 130 from the memory cells included in the page in a first time slot, to be included in the first threshold voltage interval. The programming unit 120 may change the threshold voltage of each memory cell with the adjusted threshold voltage to be included in the target threshold voltage interval in a second time slot. The target threshold voltage interval may be determined by the memory device 100 based on the pattern of data to be programmed in each memory cell with the adjusted threshold voltage.

The memory device 100 may program the memory cell in the first time slot so that the threshold voltage of the memory cell programmed to correspond to the target threshold voltage interval may correspond to the first threshold voltage interval. The memory device 100 may also program the memory cell for the second time slot so that the threshold voltage of the memory cell may correspond to the target threshold voltage. The memory device 100 may set the first threshold voltage interval to be positioned between the initialized threshold voltage interval and the target threshold voltage interval. The memory device 100 may perform a process of changing the threshold voltage of the memory cell to the target threshold voltage interval through at least two operations and thus it may be possible to prevent the threshold voltage of the memory cell from radically changing. The memory device 100 may enable the threshold voltage of the memory cell to not change significantly and thereby reduce the distortion of the threshold voltage of the memory that may occur due to floating gate (FG) coupling and the like.

FG coupling may denote a phenomenon where a threshold voltage of a central memory cell is affected by a change amount of threshold voltage of surrounding memory cells. Due to coupling of a parasitic capacitance between floating gates of memory cells, the threshold voltage of the central memory cell may be affected.

If the programming process increases the threshold voltage, FG coupling may cause the threshold voltage of the central memory cell to be increased to greater than a desired value. Due to mechanisms such as FG coupling, a distribution of threshold voltage of memory cells may be spread.

Since a voltage window where a multi-bit cell operates may be limited, a distribution of the threshold voltage may overlap another distribution of an adjacent threshold voltage as the distribution of the threshold voltage spreads. As an overlapping level of the threshold voltage increases, an error rate of inaccurately reading programmed data may also increase.

According to example embodiments, the memory cell array 110 may include a plurality of multi-bit cells.

The programming unit 120 may simultaneously program multi-bit cells included in a single page. In this instance, a first bit layer of data to be stored in the page may be referred to as a first data page. A second bit layer of data to be stored in the page may be referred to as a second data page. The programming unit 120 may initially program the first data page in multi-bit cells included in the page and then subsequently program the second data page in the multi-bit cells of the page.

The controller 130 may identify a multi-bit cell corresponding to the first threshold voltage interval from the multi-bit cells included in the page, based on the first data page and the second data page. For example, the controller 130 may identify a multi-bit cell storing first data page "1" and second data page "0" as the multi-bit cell corresponding to the first threshold voltage interval. The first threshold voltage interval may be a target threshold voltage interval with respect to the multi-bit cell storing first data page "1" and second data page "0".

While programming the first data page in remaining multi-bit cells excluding the identified multi-bit cell, the programming unit 120 may adjust the threshold voltage of the identified multi-bit cell to be included in a second threshold voltage interval. The memory device 100 may set the second threshold voltage interval to be positioned between the first threshold voltage interval and the initialized threshold voltage interval.

The programming unit 120 may initially program the first data page in the multi-bit cells included in the page and then program the second data page therein. While the second data page is being programmed, the programming unit 120 may change the threshold voltage of the identified multi-bit cell to be included in the first threshold voltage.

According to example embodiments, the programming unit 120 and the controller 130 may be included in a peripheral circuit of the memory cell array 110. Data to be programmed by the programming unit 120 may be temporarily stored in a page buffer (not shown). The page buffer may have a storage space corresponding to a number of multi-bit cells included in the page. The page buffer may temporarily maintain the stored data while data is being programmed by the programming unit 120. Elements of the page buffer may correspond to the multi-bit cells included in the page, respectively. The controller 130 may control the page buffer to store the first data page in elements corresponding to the remaining multi-bit cells excluding the identified multi-bit cells, and to store data corresponding to the second threshold voltage interval in elements corresponding to the identified multi-bit cells. While the programming unit 120 programs the first data page, the page buffer may maintain the stored data so that each of the identified multi-bit cells may form the second threshold voltage interval.

According to example embodiments, the controller 130 may be included in a memory controller (not shown) positioned outside the memory cell array 110 and the programming unit 120. In this instance, the controller 130 included in the memory controller may generate a corrected first data page based on the first data page and the second data page. The corrected first data page may include data corresponding to the first data page and the second threshold voltage interval. The controller 130 included in the memory controller may transmit the corrected first data page to the programming unit 120. The programming unit 120 may program the corrected first data page in the multi-bit cells included in the memory cell array 110.

According to example embodiments, the controller 130 included in the memory controller may transmit the first data page to the programming unit 120. The programming unit 120 may program the first data page in the memory cell array 110. The controller 130 included in the memory controller may generate data corresponding to the second threshold voltage interval associated with the identified multi-bit cells based on the first data page and the second data page. The controller 130 included in the memory controller may transmit data corresponding to the second threshold voltage interval to the programming unit 120. The programming unit 120 may program the data corresponding to the second threshold voltage interval in the multi-bit cells that are identified from the multi-bit cells of the memory cell array 110. The controller 130 included in the memory controller may transmit the second data page to the programming unit 120. The programming unit 120 may program the second data page in the multi-bit cells of the memory cell array 110.

Figure 2:
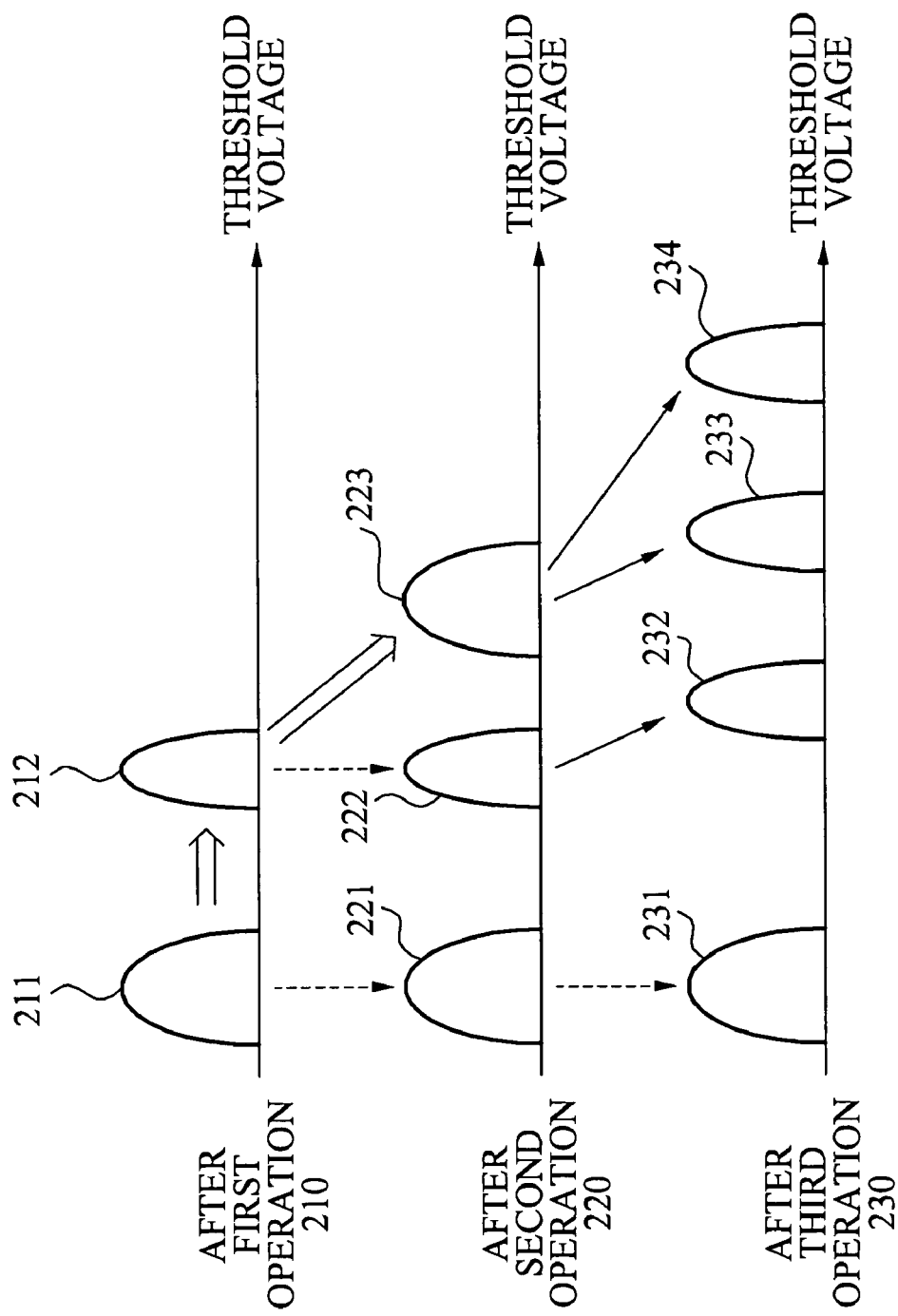
FIG. 2 illustrates an example of an operation of the memory device shown in FIG. 1.

FIG. 2 illustrates an example of an operation of the memory device 100 shown in FIG. 1.

FIG. 2 shows a number of memory cells corresponding to a threshold voltage. The number of memory cells corresponding to the threshold voltage may be referred to as a distribution of the threshold voltage.

A distribution diagram 210 exhibits a distribution of the threshold voltage after a first operation is completed by the memory device 100. The memory device 100 may identify first memory cells with a threshold voltage to be changed. The first memory cells may be memory cells to store data "10", "01", or "00". The memory device 100 may adjust the threshold voltage of each of the identified first memory cells to correspond to a distribution 212. A threshold voltage of remaining memory cells excluding the identified first memory cells may correspond to a distribution 211. The distribution 211 may denote an initialized threshold voltage interval. The remaining memory cells may be memory cells to store data "11". Herein, an operation of programming, by the memory device 100, the first memory cells to correspond to the distribution 211 may be referred to as the first operation.

A distribution diagram 220 exhibits a distribution of the threshold voltage after a second operation is completed by the memory device 100. The memory device 100 may program memory cells to store data "01" or "00", among the first memory cells to correspond to a distribution 223, based on a first data page to be programmed in the first memory cells corresponding to the distribution 212. The memory device 100 may maintain a threshold voltage of memory cells to store data "10", among the first memory cells, to form a distribution 222. The memory device 100 may maintain a threshold voltage of memory cells to store data "11" to form an initial distribution 221. During the second operation, memory cells to store first data page "1" may not be programmed by the memory device 100 and memory cells to store first data page "0" may be programmed to correspond to a distribution 223 by the memory device 100. Accordingly, the second operation may be an operation of programming the first data page.

A distribution diagram exhibits a distribution of a threshold voltage after a third operation is completed by the memory device 100. The memory device 100 may maintain the threshold voltage of memory cells to store data "11" to correspond to an initial distribution 231. The memory device 100 may program the memory cells corresponding to the distribution 222 so that a threshold voltage of memory cells corresponding to the distribution 222, for example, the memory cells to store data "10," may form a distribution 232. The memory device 100 may program the memory cells to store data "01" so that a threshold voltage of memory cells to store data "01" among the memory cells corresponding to the distribution 223 may form a distribution 233. The memory device 100 may program the memory cells to store data "00" so that a threshold voltage of memory cells to store data "00" among the memory cells corresponding to the distribution 223 may form a distribution 234.

After a third operation is completed, a memory cell storing data "11" may form a distribution 231, a memory cell storing data "10" may form a distribution 232, a memory cell storing data "01" may form a distribution 233, and a memory cell storing data "00" may form a distribution 234.

The memory device 100 may change a threshold voltage of the memory cell storing data "10" by performing the first operation and the third operation. The memory device 100 may reduce a radical change in the threshold voltage of the memory cell. Also, the memory device 100 may reduce a distortion of the distribution of the threshold voltage by FG coupling that may occur due to the radical change in the threshold voltage of the memory cell.

The memory device 100 may set the first threshold voltage interval based on a distance between the distribution 231 corresponding to the initialized threshold voltage interval and the distribution 232 corresponding to the target threshold voltage interval of the memory cell to store data "10". The memory device 100 may program the first memory cells to form the distribution 212 corresponding to the first threshold voltage interval.

Figure 3:
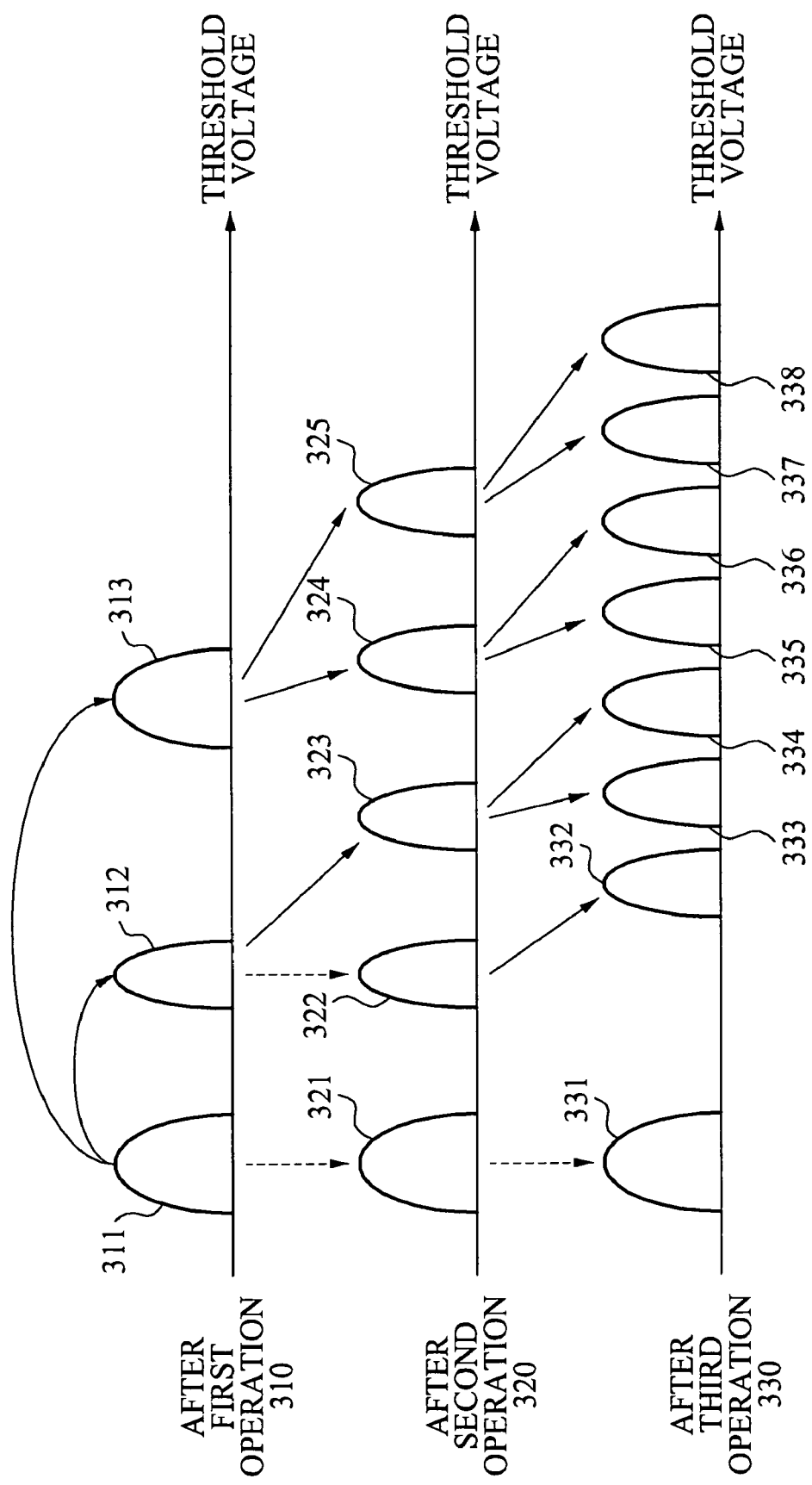
FIG. 3 illustrates another example of an operation of the memory device shown in FIG. 1.

FIG. 3 illustrates another example of an operation of the memory device 100 shown in FIG. 1.

Referring to FIG. 3, the horizontal axis denotes a number of memory cells corresponding to a threshold voltage.

A distribution diagram 310 exhibits a distribution of a threshold voltage after a first operation is completed by the memory device 100. The memory device 100 may program memory cells to store first data page "0" among memory cell forming an initial distribution 311, to correspond to a distribution 313. Since the memory device 100 programs a portion of the memory cells forming the distribution 311 to correspond to the distribution 313 based on the first data page, the above programming operation may be regarded as an operation of programming a first data page.

The memory device 100 may identify memory cells to store data "110", "101", or "100 as second memory cells. While programming the first data page, the memory device 100 may program the identified second memory cells to correspond to a distribution 312.

A distribution diagram 320 exhibits a distribution of a threshold voltage after a second operation is completed by the memory device 100. While the second operation is being performed, the memory device 100 may not change a threshold voltage of memory cells to store second data page "1" among the memory cells storing first data page "1", for example, among the memory cells corresponding to the distribution 311 or the distribution 312. Since a threshold voltage of the memory cells corresponding to the distribution 311 does not change while the second operation is being performed, the memory cells corresponding to the distribution 311 may form a distribution 321 after the second operation is completed. Also, since a threshold voltage of the memory cells corresponding to the distribution 312 does not change while the second operation is being performed, the memory cells corresponding to the distribution 312 may form a distribution 322 after the second operation is completed.

The memory device 100 may program memory cells to store second data page "0", among the memory cells corresponding to the distribution 312, to form a distribution 323.

The memory device 100 may program the memory cells to store second data page "1", among the memory cells storing first data page "0", that is, among the memory cells corresponding to the distribution 313, to form a distribution 324. The memory device 100 may program the memory cells to store second data page "0" among the memory cells storing first data page "0", to form a distribution 325. Since the second operation is performed based on the first data page and the second data page to be stored in the memory cells, the second operation may be regarded as an operation of programming a second data page.

A distribution diagram 330 exhibits a distribution of a threshold voltage after a third operation is completed by the memory device 100. The third operation may be an operation of programming, by the memory device 100, a third data page. The memory device 100 may set a target threshold voltage interval of each of memory cells based on a value of the third data page and program each of the memory cells so that a threshold voltage of each memory cell may be included in the target threshold voltage interval.

After the third operation is completed by the memory device 100, memory cells storing data "111" may form a distribution 331. Memory cells storing data "110" may form a distribution 332. Memory cells storing data "101" may form a distribution 333. Memory cells storing data "100" may form a distribution 334.

Memory cells storing data "011" may form a distribution 335. Memory cells storing data "010" may form a distribution 336. Memory cells storing data "001" may form a distribution 337. Memory cells storing data "000" may form a distribution 338.

While programming the first data page, the memory device 100 may program second memory cells to form the distribution 312. The memory device 100 may program the second data page and the third data page in the second memory cells.

The memory device 100 may distribute the change in a threshold voltage of memory cells to be programmed from the initialized distribution 311 to the distribution 323 through the first operation and the second operation. The memory device 100 may distribute the change in a threshold voltage of memory cells to be programmed from the initialized distribution 311 to the distribution 332. The memory device 100 may distribute the change of the threshold voltage of memory cells using a plurality of programming operations, and thereby reducing the radical change in the threshold voltage and the distribution distortion by FG coupling.

The memory device 100 may set an intermediate threshold voltage state based on the distance between the distributions 321 and 323, and may also set an intermediate threshold voltage state based on the distance between the distributions 331 and 332. The intermediate threshold voltage state may correspond to the distributions 312 and 322.

The memory device 100 may set a width of the intermediate threshold voltage state based on a width of the distribution 313 that is formed by the memory cells with the programmed first data page "0". The memory device 100 may form the distribution 312 based on the intermediate threshold voltage state.

Figure 4:
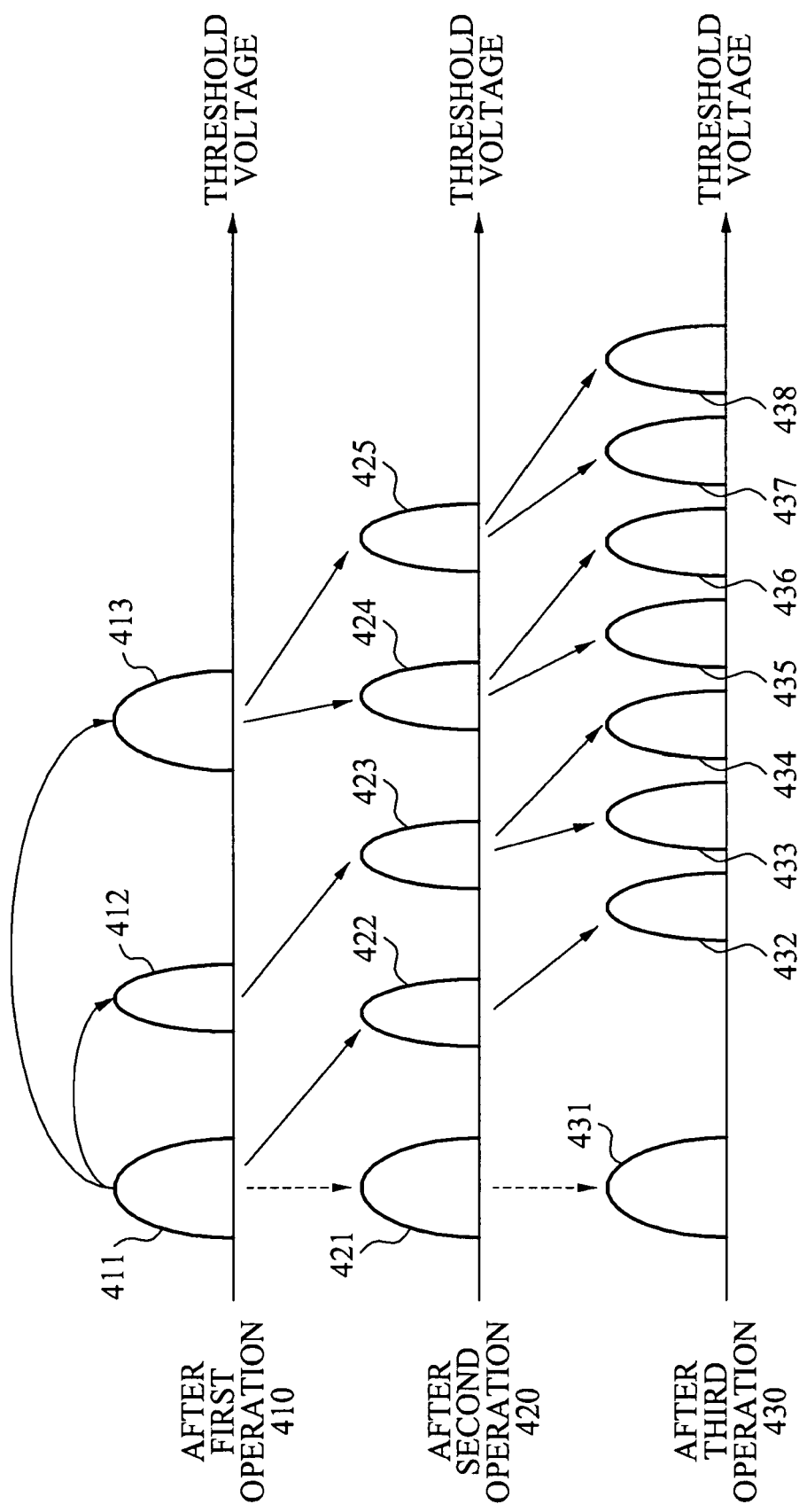
FIG. 4 illustrates still another example of an operation of the memory device shown in FIG. 1.

FIG. 4 illustrates still another example of an operation of the memory device shown in FIG. 1.

FIG. 4 shows denotes a number of memory cells corresponding to a threshold voltage.

A distribution diagram 410 exhibits a distribution of the threshold voltage after a first operation is completed by the memory device 100. The first operation may be an operation of programming, by the memory device 100, a first data page. The memory device 100 may program memory cells to store first data page "0" among memory cells forming an initial distribution 411 to correspond to a distribution 413.

The memory device 100 may identify memory cells to store data "101" or "100" as third memory cells. The third memory cells may be memory cells to store first data page "1" and second data page "0". While programming the first data page, the memory device 100 may program the identified third memory cells to correspond to a distribution 412.

A distribution diagram 420 exhibits a distribution of a threshold voltage after a second operation is completed by the memory device 100. The second operation may be an operation of programming, by the memory device, a second data page. The memory device 100 may program memory cells corresponding to the distribution 412 to form a distribution 423.

The memory device 100 may program memory cells to store second data page "1" among memory cells storing first data page "0", for example, memory cells corresponding to a distribution 413, to form a distribution 424. The memory device 100 may program memory cells to store second data page "0" among the memory cells storing first data page "0", to form a distribution 425. The memory device 100 may not change a threshold voltage of memory cells to store second data page "1" among the memory cells corresponding to the distribution 411 while the second operation is being performed. Since the threshold voltage of memory cells to store second data page "1" among the memory cells corresponding to the distribution 411 does not change while the second operation is being performed, the memory cells to store second data page "1" may form a distribution 421 after the second operation is completed.

An operation of forming, by the memory device, the distributions 421, 423, 424, and 425 may be an operation of programming a second data page. The memory device 100 may identify, as fourth memory cells, memory cells to store third data page "0" from the memory cells corresponding to the distribution 411. While programming the second data page, the memory device 100 may program the identified fourth memory cells so that a threshold voltage of the identified memory cells may form a distribution 422. After the first operation is completed, the memory cells corresponding to the distribution 411 may be memory cells storing first data page "1" and second data page "1". Therefore, the identified fourth memory cells may store data "110".

The memory device 100 may set a location of the distribution 412 based on a difference between the distributions 413 and 425. The memory device 100 may set the location of the distribution 412 so that a difference between the distributions 412 and 423 may be equal to the difference between the distributions 413 and 425. The memory device 100 may minimize the effect that the programming operation for enabling the memory cells corresponding to the distribution 412 to form the distribution 423 may affect the operation of programming the second data page.

A distribution diagram 430 exhibits a distribution of a threshold voltage after a third operation is completed by the memory device 100. The third operation may be an operation of programming, by the memory device 100, a third data page. The memory device 100 may set a target threshold voltage interval of each of memory cells based on a value of the third data page, and program each memory cell so that a threshold voltage of each memory cell may be included in the target threshold voltage interval.

After the third operation is completed by the memory device 100, memory cells storing data "111" may form a distribution 431. Memory cells storing data "110" may form a distribution 432. Memory cells storing data "101" may form a distribution 433. Memory cells storing data "100" form a distribution 434.

Memory cells storing data "011" may form a distribution 435. Memory cells storing data "010" may form a distribution 436. Memory cells storing data "001" may form a distribution 437. Memory cells storing data "000" may form a distribution 438.

While programming the first data page, the memory device 100 may program the third memory cells to form the distribution 412. The memory device 100 may program the second data page and the third data page in the third memory cells. The memory device 100 may distribute a change in a threshold voltage of memory cells to be programmed from the initialized distribution 411 to the distribution 423 through the first operation and the second operation. The memory device 100 may distribute the change of the threshold voltage of memory cells using a plurality of programming operations, and thereby reducing the radical change in the threshold voltage and the distribution distortion by FG coupling.

While programming the second data page, the memory device 100 may program fourth memory cells to form the distribution 422. The memory device 100 may program the third data page in the fourth memory cells. The memory device 100 may distribute a change of a threshold voltage of memory cells to be programmed from the initialized distribution 421 to the distribution 432 through the second operation and the third operation.

The memory device 100 may set a location of the distribution 422 based on a difference between the distributions 423 and 434. The memory device 100 may set the location of the distribution 422 so that a difference between the distributions 422 and 432 may be equal to the difference between the distributions 423 and 434. The memory device 100 may minimize the effect that the programming operation for enabling the memory cells corresponding to the distribution 422 to form the distribution 432 affects the operation of programming the third data page.

Figure 5:
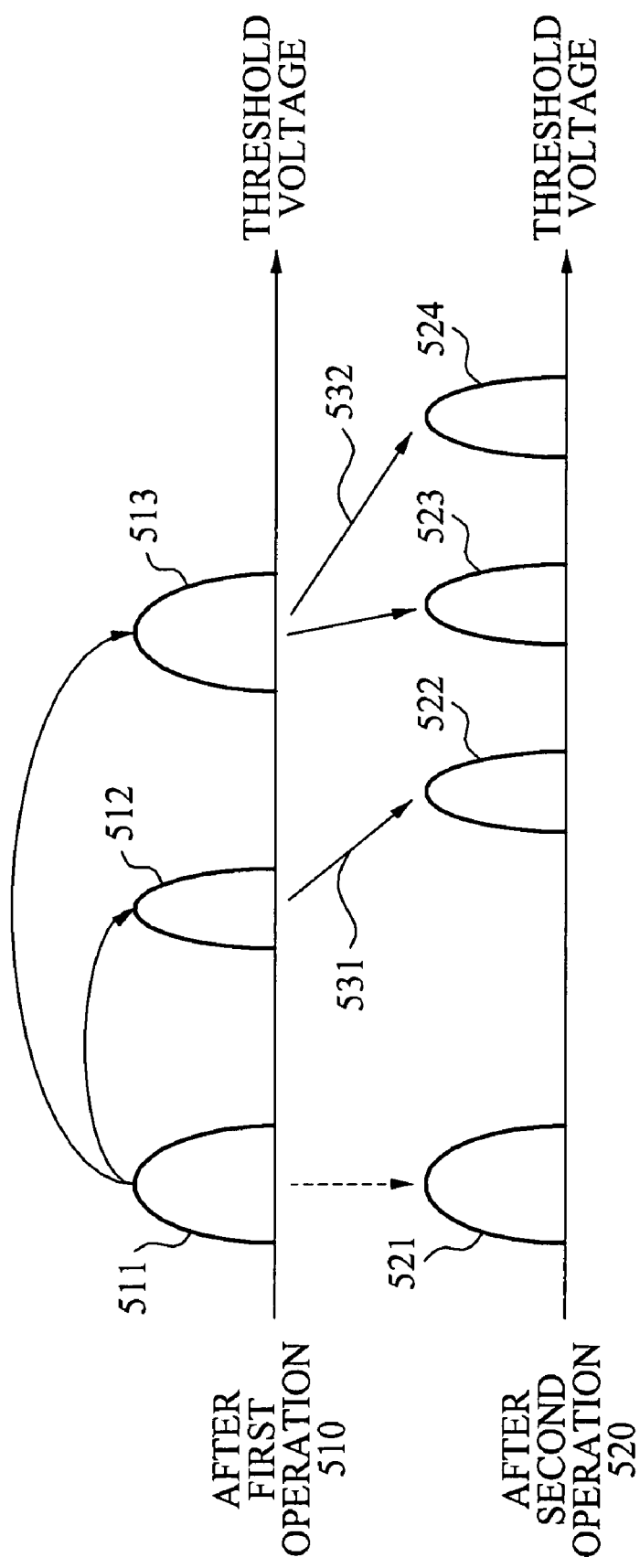
FIG. 5 illustrates yet another example of an operation of the memory device shown in FIG. 1.

FIG. 5 illustrates a yet another example of an operation of the memory device 100 shown in FIG. 1.

FIG. 5 shows a number of memory cells corresponding to a threshold voltage.

A distribution diagram 510 exhibits a distribution of the threshold voltage after a first operation is completed by the memory device 100. The first operation may be an operation of programming, by the memory device 100, a first data page. The memory device 100 may program memory cells to store first data page "0" among memory cells forming an initialized distribution 511, to correspond to a distribution 513. The memory device 100 may identify, as fifth memory cells, memory cells to store second data page "0" from the memory cells to store first data page "1". While programming the first data page, the memory device 100 may program the identified fifth memory cells so that a threshold voltage of the identified fifth memory cells may form a distribution 512.

A distribution diagram 520 exhibits a distribution of the threshold voltage after a second operation is completed by the memory device 100. The second operation may be an operation of programming, by the memory device 100, a second data page. The memory device 100 may not change a threshold voltage of memory cells to store data "11", so that the memory cells to store data "11" may form a distribution 521.

The memory device 100 may program the fifth memory cells corresponding to the distribution 512 to form a distribution 522. The fifth memory cells forming the distribution 522 may store data "10". The memory device 100 may program memory cells to store second data page "1" among the memory cells corresponding to the distribution 513, to form a distribution 523. The memory device 100 may program memory cells to store second data page "0" among the memory cells corresponding to the distribution 513, to form a distribution 524.

While the memory device 100 programs the second data page, processes 531 and 532 may experience a relatively great change in a threshold voltage. The process 531 denotes a process where the fifth memory cells corresponding to the distribution 512 may form the distribution 522. The process 532 denotes a process where the memory cells to store second data page "0" among the memory cells corresponding to the distribution 513 may form the distribution 524.

A change in the threshold voltage by the process 531 may distort a distribution of threshold voltage of surrounding memory cells due to FG coupling. The memory device 100 may set the distribution 512 so that a change in a threshold voltage by the process 531 may be less than or equal to a change of a threshold voltage by the process 532.

Figure 6:
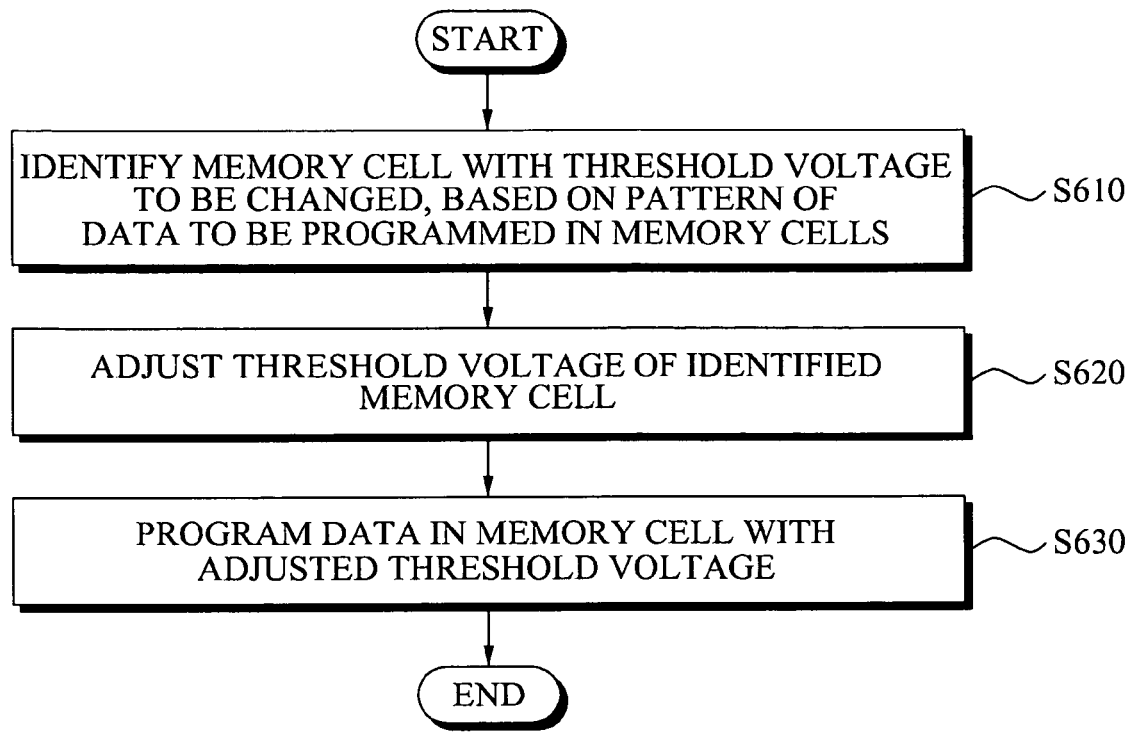
FIG. 6 is a flowchart illustrating an example of a memory programming method according to example embodiments.

FIG. 6 is a flowchart illustrating an example of a memory programming method according to example embodiments.

Referring to FIG. 6, in operation S610, the memory programming method may identify a memory cell with a threshold voltage to be changed from the plurality of memory cells, based on a pattern of data to be programmed in the plurality of memory cells.

In operation S620, the memory programming method may adjust a threshold voltage of the identified memory cell. According to example embodiments, the memory programming method may apply a program condition voltage to the identified memory cell until the threshold voltage of the memory cell is included in a first threshold voltage interval, to thereby adjust the threshold voltage of the identified memory cell.

In operation S630, the memory programming method may program the data in the memory cell with the adjusted threshold voltage.

Figure 7:
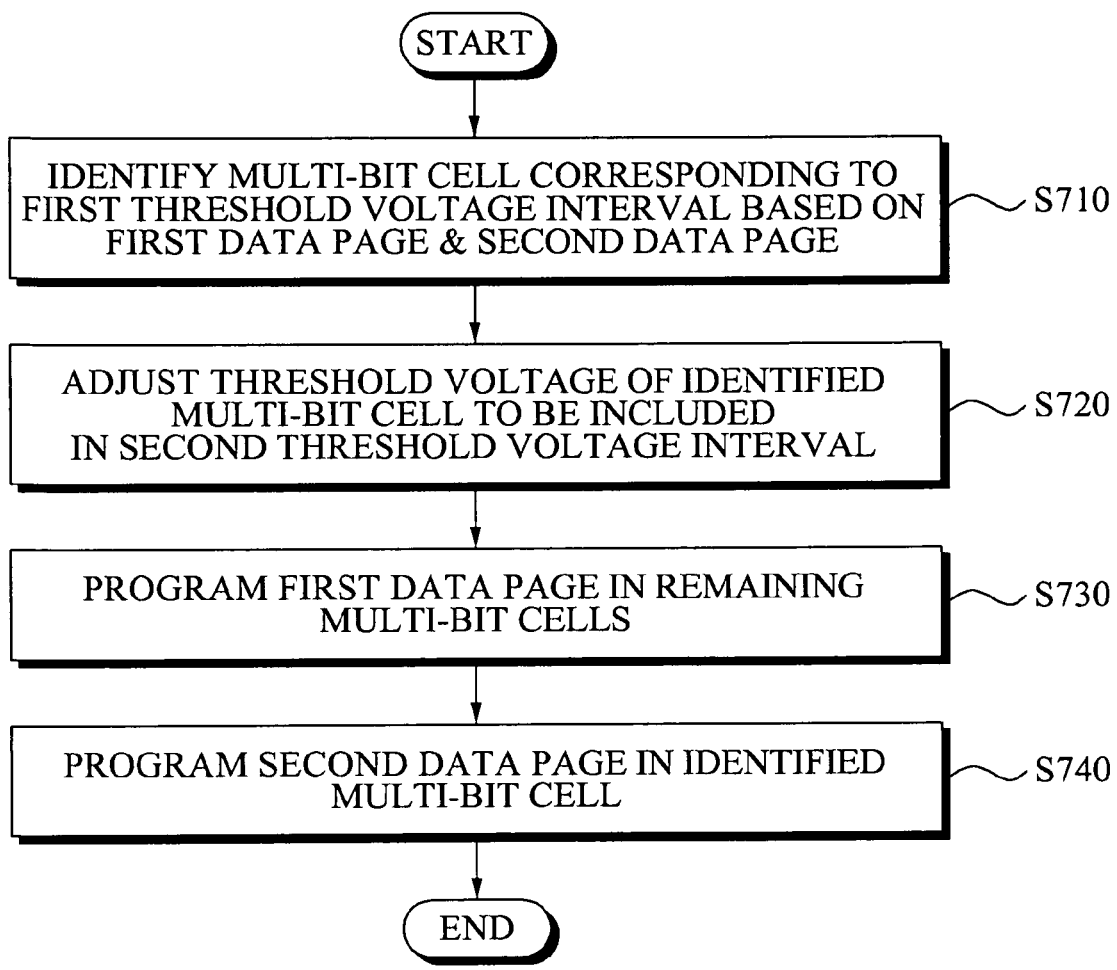
FIG. 7 is a flowchart illustrating another example of a memory programming method according to example embodiments.

FIG. 7 is a flowchart illustrating another example of a memory programming method according to example embodiments.

Referring to FIG. 7, in operation S710, the memory programming method may identify a multi-bit cell corresponding to a first threshold voltage interval from a plurality of multi-bit cells based on a first data page and a second data page to be programmed in the plurality of multi-bit cells.

In operation S720, the memory programming method may adjust a threshold voltage of the identified multi-bit cell to be included in a second threshold voltage interval.

In operation S730, the memory programming method may program the first data page in the remaining multi-bit cells excluding the identified multi-bit cell among the plurality of multi-bit cells.

In operation S740, the memory programming method may program the second data page in the identified multi-bit cell.

The memory programming method may perform operation S720 while operation S730 is being performed.

According to example embodiments, in operation S740, the memory programming method may change the threshold voltage of the identified bit cell to be included in the first threshold voltage interval.

While programming the second data page in the remaining multi-bit cells, the method programming method may perform operation S740.

The memory programming method according to example embodiments may be recorded in computer-readable media including program instructions to implement various operations embodied by a computer. The media may also include, alone or in combination with the program instructions, data files, data structures, and/or the like. The media and program instructions may be those especially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are especially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

Example embodiments may be applicable to memory devices that change a threshold voltage of a memory cell to thereby store data, for example, a flash memory, electrically erasable programmable read only memory (EEPROM), and the like.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In example embodiments, the memory controllers may be constructed to communicate with an external device for example, a host using any one of various types of protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system, according to example embodiments, may include a microprocessor that may be electrically connected with a bus, a user interface, a modem such as a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage to the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

While example embodiments have been particularly shown and described, it will be understood by those of ordinary skill in the art that various changes in form and details may be made therein without departing from the spirit and scope of example embodiments as defined by the following claims.

What is claimed is:

1. A memory programming method comprising:
   identifying at least one of a plurality of memory cells with a threshold voltage to be changed based on a pattern of data to be programmed in the at least one of the plurality of memory cells;
   applying a program condition voltage to the at least one identified memory cell until the threshold voltage of the at least one identified memory cell is included in a first threshold voltage interval, to thereby adjust the threshold voltage of the at least one identified memory cell; and
   programming the data in the at least one identified memory cell with the adjusted threshold voltage.

2. The method of claim 1, wherein the programming comprises:
   changing the threshold voltage of the at least one identified memory cell with the adjusted threshold voltage until the threshold voltage of the at least one identified memory cell is included in a second threshold voltage interval corresponding to the data.

3. The method of claim 2, further comprising:
   setting the first threshold voltage interval based on a distance between an initial threshold voltage interval and the second threshold voltage interval.

4. The method of claim 3, wherein the identifying identifies the plurality of memory cells such that each of the memory cells is a multi-bit cell capable of storing multi-bit data.

5. The method of claim 4, wherein the identifying identifies at least one of a plurality of memory cells based on a pattern of a plurality of data pages to be programmed in the plurality of memory cells.

6. The method of claim 5, wherein the applying sets a target threshold voltage interval in the at least one identified memory cell with the adjusted threshold voltage based on the pattern of the plurality of data pages, and changes the threshold voltage of the at least one identified memory cell with the adjusted threshold voltage until the threshold voltage of the at least one identified memory cell with the adjusted threshold voltage is included in the set target threshold voltage interval.

7. The method of claim 1, wherein the identifying identifies the plurality of memory cells such that each of the memory cells is a multi-bit cell capable of storing multi-bit data.

8. The method of claim 1, wherein the identifying identifies at least one of a plurality of memory cells based on a pattern of a plurality of data pages to be programmed in the plurality of memory cells.

9. A computer-readable medium storing a program for implementing the method of claim 1.

10. A memory programming method comprising:
    identifying at least one of a plurality of multi-bit cells corresponding to a first threshold voltage interval based on a first data page and a second data page to be programmed in the at least one of the plurality of multi-bit cells;
    adjusting a threshold voltage of the at least one identified multi-bit cell to be included in a second threshold voltage interval;
    programming the first data page in a remaining plurality of multi-bit cells that exclude the at least identified multi-bit cell; and
    programming the second data page in the at least one identified multi-bit cell.

11. The method of claim 10, wherein the adjusting is performed while the programming of the first data page is being performed.

12. The method of claim 11, wherein the programming of the second data page includes changing the threshold voltage of the at least one identified multi-bit cell to be included in the first threshold voltage interval.

13. The method of claim 12, wherein the programming the first data page includes controlling a width of the second threshold voltage interval based on a width of a distribution of threshold voltages that is formed by the remaining plurality of multi-bit cells while programming the first data page.

14. The method of claim 10, wherein the programming of the second data page includes changing the threshold voltage of the at least one identified multi-bit cell to be included in the first threshold voltage interval.

15. The method of claim 10, wherein the programming the first data page includes controlling a width of the second threshold voltage interval based on a width of a distribution of threshold voltages that is formed by the remaining plurality of multi-bit cells while programming the first data page.

16. The method of claim 10, further comprising:
    programming the second data page in the remaining plurality of multi-bit cells, wherein the programming of the second data page in the at least one identified multi-bit cell is performed while the programming of the second data page in the remaining plurality of multi-bit cells is being performed.

17. The method of claim 10, further comprising:
setting the second threshold voltage interval so that a difference between the first threshold voltage interval and the second threshold voltage corresponds to a threshold voltage change of the plurality of multi-bit cells while programming the second data page.

18. The method of claim 10, further comprising:
setting the second threshold voltage interval based on a distance between an initial threshold voltage interval and the first threshold voltage interval.

19. A computer-readable medium storing a program for implementing the method of claim 10.

* * * * *